United States Patent [19]

Matsumoto et al.

[11] Patent Number: 4,645,560
[45] Date of Patent: Feb. 24, 1987

[54] LIQUID ENCAPSULATION METHOD FOR GROWING SINGLE SEMICONDUCTOR CRYSTALS

[75] Inventors: Kazuhisa Matsumoto; Hiroshi Morishita; Shinichi Akai, all of Itami; Shintaro Miyazawa, Isehara, all of Japan

[73] Assignees: Sumito Electric Industries, Ltd.; Nippon Telegraph and Telephone, both of Japan

[21] Appl. No.: 644,009

[22] Filed: Aug. 24, 1984

[30] Foreign Application Priority Data

Aug. 26, 1983 [JP] Japan .................. 58-154771

[51] Int. Cl.⁴ .............. C30B 15/22; C30B 27/02
[52] U.S. Cl. ............... 156/607; 156/617 SP; 422/249
[58] Field of Search ......... 156/607, 617 SP, DIG. 70, 156/DIG. 73, 601, 603; 422/249; 219/425

[56] References Cited

U.S. PATENT DOCUMENTS

| | | | |
|---|---|---|---|
| 4,140,570 | 2/1979 | Voltmer et al. | 156/617 SP |
| 4,314,128 | 2/1982 | Chitre | 156/DIG. 73 |
| 4,556,784 | 12/1985 | Nakai | 432/1 X |

FOREIGN PATENT DOCUMENTS

| | | | |
|---|---|---|---|
| 132704 | 10/1978 | Fed. Rep. of Germany | 156/DIG. 73 |
| 52-63877 | 5/1977 | Japan | 156/DIG. 73 |
| 39787 | 10/1977 | Japan . | |
| 11897 | 1/1982 | Japan . | |
| 57-179095 | 11/1982 | Japan | 156/617 SP |
| 58-135626 | 8/1983 | Japan | 156/607 |

OTHER PUBLICATIONS

Nikkei Electronics, May 24, 1982, by Tade et al.

*Primary Examiner*—Barry S. Richman
*Assistant Examiner*—Michael S. Gzybowski
*Attorney, Agent, or Firm*—Griffin, Branigan, & Butler

[57] ABSTRACT

A liquid encapsulation Czockralski method for growing a single crystal of a semiconductor compound which comprises: melting a semiconductor compound in the presence of a $B_2O_3$ liquid encapsulant to form a two phase liquid; dipping a semiconductor seed crystal into the compound melt covered with the $B_2O_3$ encapsulant; growing the crystal from the compound melt by pulling up and rotating the seed crystal; and, cooling the crystal in a cooling zone above a crucible. The cooling zone is maintained at a substantially uniform temperature distribution with a small temperature gradient by using primarily an independently controlled crystal cooling zone heater H3. In addition, an independently controlled melt heater H1 and an independently controlled crystal growing heater H2 are employed. Also, a crystal cooling zone heat shield 11 can be provided to aid in slowly cooling the grown crystal in the substantially uniform temperature distribution. Preferably, a crystal cooling zone heater H3 is employed to control the temperature distribution in the cooling zone. The semiconductor crystals produced by employing the process and apparatus of the invention are substantially crack-free both before and after grinding and cutting. Also the etch pitch density (EPD) of the semiconductor crystal material is significantly lower than conventionally produced material.

3 Claims, 11 Drawing Figures

FIG.4A
FIG.4B
FIG.4C
FIG. 5
FIG. 8
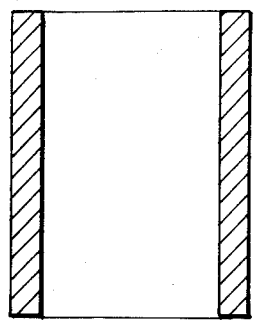
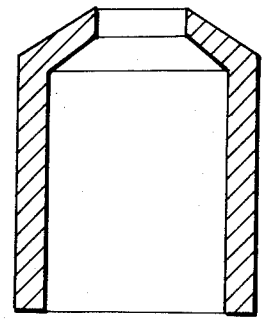
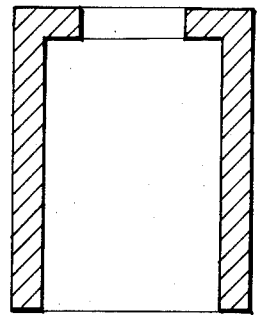
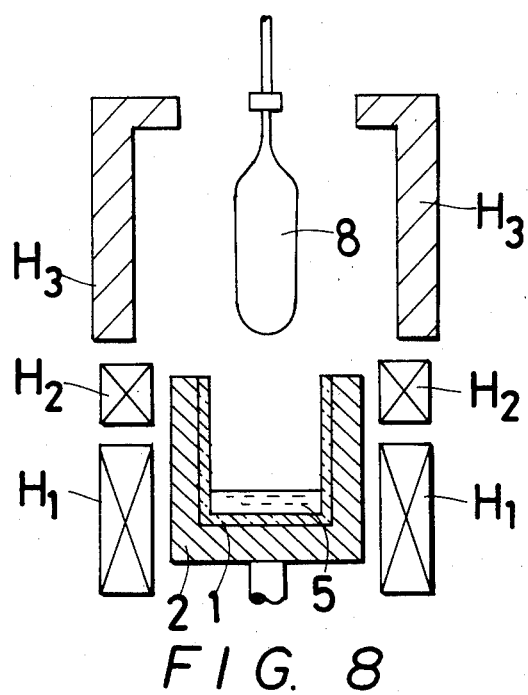
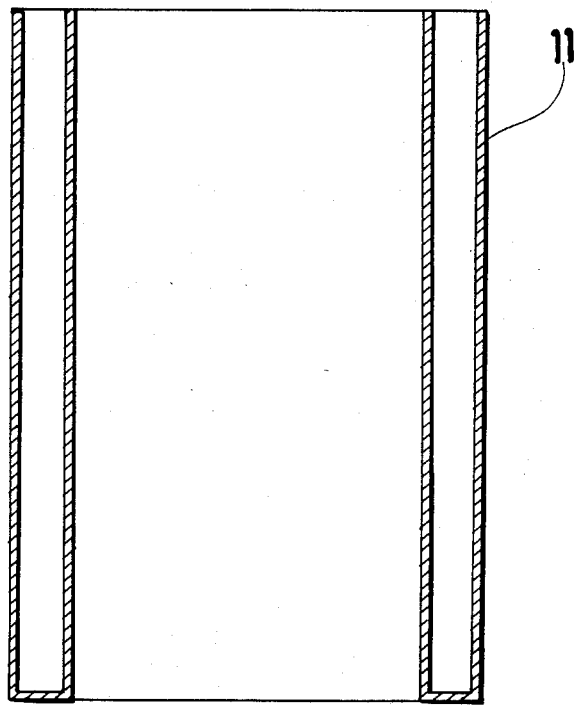

LIQUID ENCAPSULATION METHOD FOR GROWING SINGLE SEMICONDUCTOR CRYSTALS

BACKGROUND OF THE INVENTION

The invention relates to improvements in a liquid encapsulation Czockralaski method (LEC method) for growing a single semiconductor crystal by pulling up a seed crystal covered with a liquid encapsulant such as $B_2O_3$ out of a semiconductor compound melt in a heated crucible. The invention also relates to an improved apparatus for crystal growth used in carrying out the LEC method.

Semiconductor compounds produced by the LEC method include compounds of elements of Group III and Group V of the Periodic Table for example, GaAs, GaP, InP, InAs, GaSb, etc. and compounds of elements of Group IV and Group VI of the Periodic Table for example, PbTe, PbSe, SnTe, etc.

Conventional apparatus for growing a single crystal based on a LEC method generally have a single cylindrical crucible heater with a relatively large uniform thickness of heating element structure around a quartz crucible supported by a carbon support.

Another LEC apparatus for growing a single crystal is disclosed in Japanese Patent Publication No. 39787/1977 wherein the inner diameter and outer diameter of a single cylindrical quartz crucible heater vary along the axial line of the crucible adjacent the walls of the crucible.

Another LEC apparatus has two cylindrical crucible heaters where a portion of one heater is positioned near the top of the crucible and a portion of the second heater is positioned near the bottom of the crucible. Such an apparatus is disclosed in Japanese Patent Laying Open No. 11897/1982 wherein a quartz crucible is supported by a carbon support around which the two heaters are installed. The two heaters can be independently moved upwardly or downwardly. The temperature distribution in the crucible is changed by moving the crucible and its carbon support and by moving the two independent heaters upwardly or downwardly.

The above described apparatuses for carrying out an LEC method for producing a single crystal semiconductor are directed to provide a temperature environment in the crucible suitable for crystal growth in the crystal growing region of the crucible. However, a significant problem has not been addressed. In practice, the crystal pulled up from a semiconductor compound melt is cooled rapidly with non-uniform temperature distribution at a cooling zone above the crystal growing region above the crucible.

The rapid and non-uniform cooling of a single crystal semiconductor brings about the following undesirable results.

1. When the single crystal that is pulled up is cooled abruptly and irregularly by convection of highly-pressurized gas at the cooling zone above the crucible, strong thermal stress is generated in the crystal by the non-uniform distribution of temperature. As a result, many dislocations, lineages, and other lattice defects result within the crystal.

2. Even if the temperature gradient between (a) the crystal growing region corresponding to the vicinity of liquid-solid interface and (b) the space in the liquid encapsulant is reduced in order to avoid rapid cooling in the interface region, the generation of thermal stress is not adequately avoided. Large amounts of heat are transmitted vertically in the grown crystal and from the surface of the upper portion of the crystal. This occurs because the upper portion of the crystal is still exposed to a strong convection current of pressurized gas. This mode of heat dissipation causes radial temperature differences between the surface and the center of the crystal in horizontal planes normal to the vertical axis of the crystal. Thus, the grown crystal is fragile and vulnerable. The crystal is susceptible to cracking during cooling. In such a case, when the cooled crystal ingot is sliced into thin wafers, both the ingot and the wafers are apt to crack.

Accordingly, it is an object of the present invention to provide a liquid encapsulation Czockralski method and apparatus for growing single semiconductor crystals wherein control of the thermal environment of the cooling zone above the crystal growing crucible is provided.

SUMMARY OF THE INVENTION

The LEC apparatus of the invention has three independently operated temperature controlling means. The three temperature controlling means are: a heater H1 for heating the melt in the crucible; a heater H2 for controlling the thermal environment of the crystal growing zone; and, a heater H3 or a heat shield 11 for controlling the thermal environment of the cooling zone.

The cooling zone heater H3 operates independently of the first and second heaters H1 and H2 and provides a substantially uniform temperature distribution in the cooling zone. The grown crystal is slowly cooled in a controlled manner with a substantially uniform temperature distribution.

Two kinds of heat shields are applicable. A heat shield having a diameter larger than the diameter of the crucible and which is installed in the space above the crucible or a heat shield with a cylindrical shape having a diameter smaller than the crucible which can be floated in the compound melt and liquid encapsulant in the crucible.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 4A shows a sectional view of a straightwalled cylindrical device which may be either an active heater or a passive heat shield for controlling the thermal environment of the cooling zone;

FIG. 4B shows a sectional view of a cylinder having a conical top wall inclining inward which may be either an active heater or a passive heat shield for controlling the thermal environment of the cooling zone;

FIG. 4C shows a sectional view of a cylindrical device having a flat top wall which projects inward at a right angle with the cylinder wall and which may be either an active heater or a passive heat shield for controlling the thermal environment of the cooling zone;

FIG. 5 is a sectional view of an embodiment of an LEC apparatus of the invention after a single crystal has been pulled up into the cooling zone;

DETAILED DESCRIPTION OF THE PREFERRED EMBODIMENTS

Figure 1:
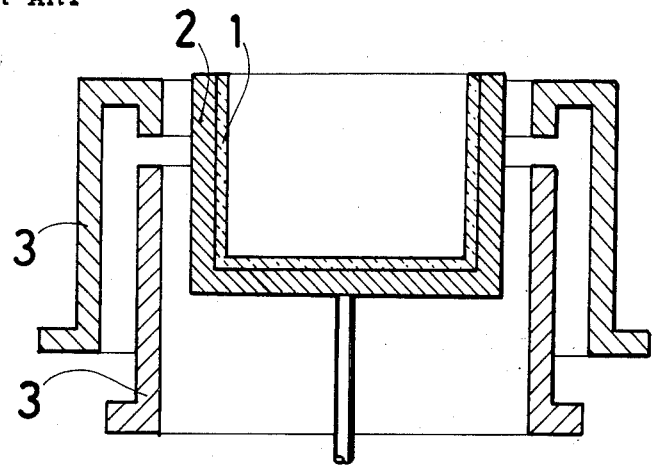
FIG. 1 is a sectional view of a crucible and heaters of a prior art LEC apparatus.
Figure 2:
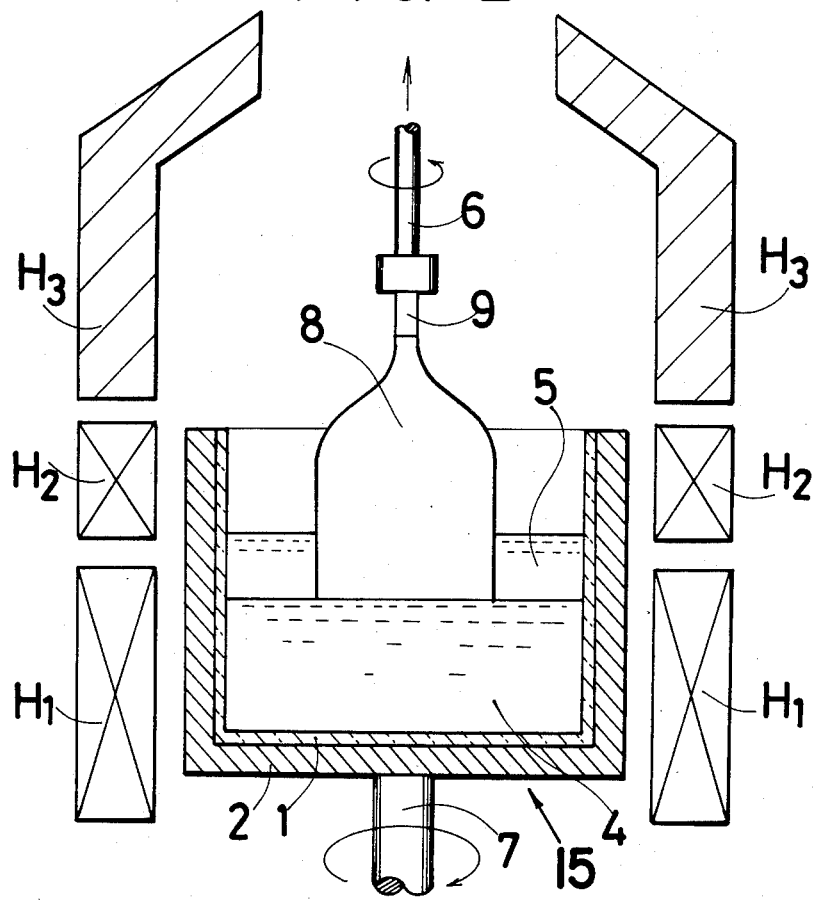
FIG. 2 is a sectional view of one embodiment of an LEC apparatus of the invention.

With reference to FIG. 2, crucible assembly 15 is comprised of crucible 1 and crucible support 2. Crucible support 1 contains a semiconductor compound melt 4 and a liquid encapsulant 5. Crucible support 2 supports the crucible 1 on the bottom and side surfaces.

An upper shaft 6 is installed along an axial line from the top of a chamber (not shown) enclosing all the elements shown in FIG. 2. The upper shaft 6 rotates and moves vertically.

A seed crystal 9 is attached to the bottom end of the upper shaft 6. The seed crystal 9 is dipped in the compound melt 4 by lowering the upper shaft 6. The upper shaft 6 then rotates and slowly moves upward. The single crystal 8 is grown on the seed crystal 9.

A lower shaft 7 supports the crucible assembly 15. The lower shaft 7 rotates and moves vertically.

Three independently controlled heaters are provided for three separately controlled thermal zones. Heater H1 is the heater for melting the semiconductor compound in the melting zone and heating the encapsulant liquid. Heater H1 heats the crucible assembly 15 and the liquids 4 and 5 in the crucible 1.

Heater H2 is the heater for heating the liquid-solid crystal interface zone between the liquid encapsulant and the single crystal in the vicinity of the liquid encapsulant. This interface zone is the single crystal growing zone. The thermal environment of the single crystal growing zone can be controlled by controlling the power of the heater H2. The heater H2 is designated as the crystal growing zone heater H2. It is noted that heater H1 also contributes to heating the liquid encapsulant 5.

Heater H3 is a heater for controlling the thermal environment of the cooling zone above the liquid encapsulant 5 and above the crucible 1. The desirable thermal environment of the cooling zone is either of uniform temperature distribution or quasi-uniform temperature distribution with a small temperature gradient. This zone is the zone in which the pulled single crystal is cooled. Thus, heater H3 is designated as the crystal cooling zone heater H3.

All the heaters H1, H2, and H3 are resistance heaters which generate Joule heat in proportion to current and voltage.

The melt-heating zone heater H1 and the crystal growing zone heater H2 jointly determine the temperature of semiconductor compound melt and the thermal environment of the crystal growing zone.

An illustration of the thermal environments in an embodiment of the LEC apparatus of the invention is provided in an example wherein GaAs is the semiconductor compound undergoing single crystal growth, and $B_2O_3$ is the liquid encapsulant.

Figure 3:
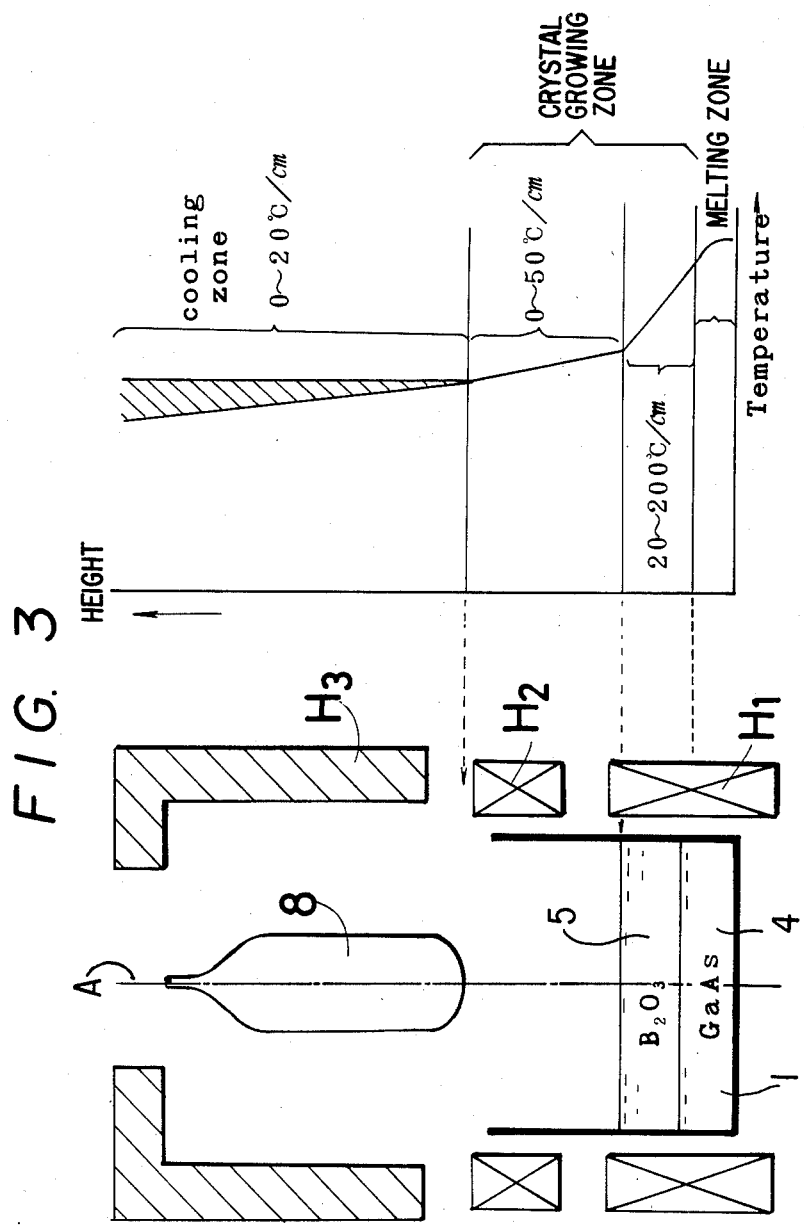
FIG. 3 is a sectional view of a second embodiment of the invention and a graph showing the temperature distribution along the axial line at the crystal growing zone and at the cooling zone of the apparatus.

FIG. 3 shows the distribution of temperature along a vertical center axis A. The temperature gradient along the axis in the crystal growing region is 20°–200° C./cm, preferably 50° C./cm, in the liquid $B_2O_3$ encapsulant; and, is 5°–50° C./cm, preferably 10° C./cm, in the inert gas above the $B_2O_3$.

As shown in the left-hand figure of FIG. 3, the cooling zone heater H3 controls the thermal environment in which the single crystal is cooled after the crystal growth is ended.

The cooling zone should be a zone having a uniform distribution of temperature or a zone having a quasi-uniform distribution with a small temperature gradient.

Such a preferred thermal cooling environment is realized mainly by controlling the cooling zone heater H3. However, the crystal growing zone heater H2 also has some influence upon the thermal environment of the cooling zone.

The right-hand side figure of FIG. 3 shows a graph of the above mentioned temperature distributions. The slant line area between the two intersecting lines in the cooling zone of the graph in FIG. 3 denotes an allowable temperature range distribution for the cooling zone.

The crystal growing zone heater H2 mainly controls the thermal environment of the liquid-solid interface, liquid encapsulant 5, and the space in the crucible 1 above the liquid encapsulant 5.

In GaAs crystal growth, a satisfactory range of temperature at the cooling zone should be adjusted to be 700° C.–1000° C. preferably at 850° C. The temperature gradient along a vertical direction at the cooling zone should be 0°–20° C./cm.

A single GaAs crystal pulled up to the cooling zone is cooled slowly when the above-mentioned temperature gradient is maintained.

FIGS. 4A, 4B, and 4C show examples of the sectional shape of cooling zone heaters H3. FIG. 4A shows a heater of a simple cylindrical shape. Both inner diameter and outer diameter are uniform along an axial direction. FIG. 4B shows a heater of a tranformed cylindrical shape having a conical top wall which inclines inwardly. FIG. 4C shows another heater of a transformed cylindrical shape having a flat top wall which projects horizontally inward at a right angle with the vertical cylinder wall.

Heaters having the sectional shapes in FIGS. 4B and 4C are preferred over the heater having the shape in FIG. 4A to form a wide zone of uniform temperature in the cooling zone.

Figure 7:
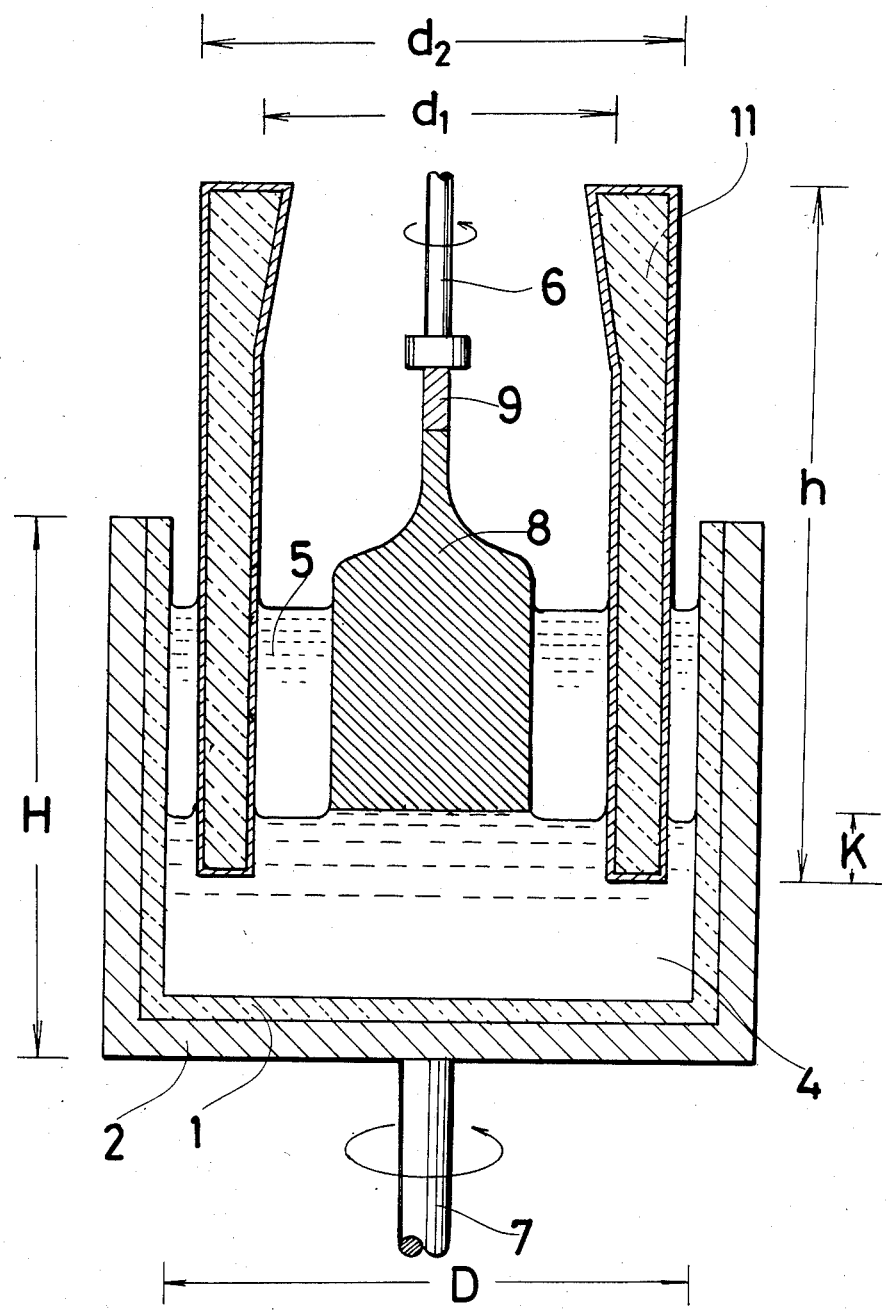
FIG. 7 is a sectional view of a third embodiment of the invention in which the heat shield for controlling the temperature of the cooling zone is a cylinder floating on semiconductor compound melt or liquid encapsulant in the crucible; and, FIG. 8 is a sectional view of an example of a floating cylinder having a hollow cavity within the inner and outer walls of the floating cylinder.

Although control of the thermal environment in the cooling zone is preferably brought about by an active cooling zone heater H3, the active heater H3 can be replaced by a passive cylindrical heat shield 11 as shown in FIG. 7. Although heat shield 11 does not actively provide heat by itself, it is heated by heat it absorbs from heat radiating from the other heaters H1 and H2. The heat shield 11 heats the cooling zone by re-radiating the heat absorbed from heaters H1 and H2.

Because the cooling zone heat shield 11 is not a heater, it is unable to control the thermal environment of the cooling zone directly. But the cooling zone heat shield 11 contributes to controlling the thermal environment of the cooling zone in an indirect manner by varying the effective powers of the heaters H1 and H2 upon the cooling zone. In addition, the heat shield 11 effectively prevents convection of inert gases present in the cooling zone. Therefore, a cooling zone heat shield 11 can replace heater H3 and can keep the thermal environment of the cooling zone uniform or quasi-uniform.

The sectional shapes shown in FIGS. 4A, 4B, and 4C for cooling zone heaters H3 are also suitable shapes for cooling zone heat shield 11.

The cooling zone heat shield 11 can be fixed upon the heater H2 and can have a diameter which is nearly equal to that of the crystal growing zone heater H2.

Alternatively, a smaller heat shield of a cylindrical shape is also suitable as a cooling zone heat shield 11. As shown in FIG. 7, the smaller heat shield 11 is placed in a crucible 1 in order to enclose a single crystal 8. The heat shield 11 in FIG. 7 floats in the semiconductor compound melt 4 and the liquid encapsulant 5. For proper operation, the bottom of the heat shield 11 must not touch the bottom of the crucible 1 so as not to prevent the circulation of the semiconductor compound melt.

Because it is floating and has cylindrical shape, the smaller heat shield 11 is called a floating cylinder 11. The floating cylinder 11 in FIG. 7 has a cylindrical sectional shape, the top portion of which inclines inward. This shape is very effective to suppress inert gas circulating between the space inside and the space outside of the floating cylinder 11 and to reduce heat dissipation by gaseous convection.

Suitable materials for fabricating for the heat shield 11 are carbon, carbon coated with BN or AlN, $SiO_2$, $Al_2O_3$, BN, $Si_3N_4$, and PBN, among others. Because of the high heat conductivity, carbon is the preferred material for a fixed heat shield. For a floating cylinder 11, the preferred material for fabrication is carbon coated with BN or AlN. The nitride coating protects the semiconductor compound melt and the single semiconductor crystal from contamination by carbon powder.

The floating cylinder 11 must float in the liquid melt. The top end of the floating cylinder must enclose the single crystal therein until crystal growth has proceeded to a considerable extent. Therefore, the effective specific gravity of the floating cylinder 11 must be lower than that of the melt in order that it float. A floating cylinder 11 with a hollow cavity shown in FIG. 8 provides a low effective specific gravity and is preferred.

Floating cylinders 11 can have various shapes—a cylinder with a step part on the inner wall, a cylinder having a widening conical upper wall with a bigger top opening, or a cylinder having a narrowing conical upper wall with a smaller top opening. The shape and the size of the floating cylinder are selected to bring about the desired thermal environment and the desired thermal conditions for pulling up the single crystal.

Various sizes of floating cylinders are suitable. But the upper limits and lower limits of sizes are determined according to the following inequalities:

$0.9D < d_2 < D$
$0.4D < d_1 < 0.9D$
$0.4H < h < 1.5H$ where $d_1$ is the inner diameter of the floating cylinder; $d_2$ is the outer diameter; h is the height of the floating cylinder 11; D is the inner diameter of the crucible 1; and, H is the height of the crucible.

A specific example of the dimensions of a suitable floating cylinder 11 and a crucible 1 is provided. Reference is made to FIG. 7 which is not drawn to scale. The height H of the crucible is 150 mm, and the inner diameter D is 150 mm. The inner diameter $d_1$ of the floating cylinder is 102 mm, and the outer diameter $d_2$ is 149 mm. The distance K from the bottom end of the floating cylinder to the liquid-solid crystal interface is 5 mm.

Numerous advantages are obtained by employing the method and apparatus of the invention. By employing the apparatus and method of the invention, a novel semiconductor crystal product is obtained. In carrying out the method of the invention, a single semiconductor crystal is pulled through the crystal growing zone having a small temperature gradient; and, the grown crystal is slowly cooled in the cooling zone having a uniform or quasi-uniform temperature distribution.

Because the temperature difference in the crystal is small, the occurrence of thermal stress in the crystal is relatively low. It is theorized that this aspect results in the following advantages observed in the semiconductor crystal product produced by the process of the invention.

(1) Dislocations, lineages and other lattice defects in the crystal are reduced in comparison with crystals produced by other methods. Distribution of etch pit density (EPD) is more uniform in a wafer produced in accordance with the invention.

(2) A reduction in the occurrence of cracks in the crystal during cooling and during a slicing operation is realized.

(3) Because the generation of thermal stress is reduced, an annealing process is unnecessary. Conventional LEC methods require an annealing process to reduce the occurrence of cracks in crystal wafers. Thus, by following the principles of the invention, a reduction in the overall amount of work to produce crystal wafers is realized.

An example of a semiconductor crystal product of the invention produced by a process of the invention is described. A GaAs crystal is pulled up in the embodiment of the LEC apparatus of the invention shown in FIG. 2. In the example, a cooling zone heater H3 is used.

EXAMPLE

| Charge of GaAs | 4 KG |
|---|---|
| Crucible made of PBN | 6 inches (inner diameter) |
| Inert gas | nitrogen gas |
| Liquid encapsulant | $B_2O_3$ |

In the example, the melt heating zone heater H1, the crystal growing zone heater H2, and the cooling zone heater H3 are turned on; and, the temperatures of the heaters rise to predetermined values.

The 4KG of solid GaAs semiconductor compound is melted in the crucible. The compound melt is covered with the liquid encapsulant. Nitrogen gas at 2-50 atm. pressure fills the chamber (not shown in Figures). The actual gas pressure required depends on the thickness of the $B_2O_3$ encapsulant layer. When the $B_2O_3$ layer is relatively thick, only 3 atm. of pressure of nitrogen gas is sufficient to adequately pressurize the $B_2O_3$ layer. In general, however, the optimum range of gas pressure is 15-20 atm.

The GaAs semiconductor compound starting material can be either polycrystalline GaAs or may be directly synthesized from pure Ga and pure As. The technique for raising the temperature of a polycrystalline GaAs starting material differs from the technique for raising the temperature in the case where a GaAs starting compound is directly synthesized from pure Ga and pure As.

When the starting material is polycrystalline GaAs, the melt-heating heater H1, the crystal growing zone heater H2, and the cooling zone heater H3 are turned on at the same time. The temperatures of the three heaters rise simultaneously in a predetermined proportion to one another. Preferably, raising the temperature of the cooling zone heater 3 is stopped when the temperature at a measuring point on the outer surface of the cooling zone heater 3 attains 870° C.

When the temperature at a measuring point at the outer surface of the melt heating heater H1 is about 1200° C., the temperature at the measuring point at the outer surface of the crystal growing zone heater H2 is about 1000° C. At this time, the melt heating heater H1 is still kept turned on. When the polycrystalline GaAs melts in the crucible, the heating of the heater H1 is stopped. The temperature of the crystal growing zone heater H2 is adjusted to be 900° C. to 1100° C. at that time. By an adequate choice of the adjusted temperature in the crystal growing zone, preselected temperature gradients in the liquid-solid interface, the $B_2O_3$ liquid, and the gaseous space in the vicinity of $B_2O_3$ are realized.

Alternatively, when a GaAs compound is directly synthesized from Ga and As in the crucible, different temperature parameters are employed. As the temperature of the heater is raised, a chemical reaction between Ga and As occurs at a high pressure (higher than 60 atm.). Thus, GaAs compound is synthesized by the chemical reaction in a direct manner.

After the direct synthesis of GaAs is completed, the pressure of the nitrogen gas is reduced. The process of raising the temperatures of heaters H1, H2, and H3 is started again and proceeds until the GaAs is molten thus providing a semiconductor compound melt.

To grow a single semiconductor crystal from a semiconductor melt, seeding with a seed semiconductor crystal is done about 30 minutes after the semiconductor compound of GaAs is melted. A seed crystal is dipped into the compound melt, and then crystal growth begins.

The preferred conditions of crystal growth are: pulling speed of seed crystal in range of 4-20 mm/hr. (preferably 10 mm/hr.); rotating rate of crucible in the range of 2-40 rpm. (preferably 12 rpm.); rotating rate of crystal in the range of 2-40 rpm. (preferably 10 rpm.); and, diameter of crystal grown preferably 3 inches.

When crystal growth is terminated, the temperature distribution in the crystal is in the range from 820°-880° C. After the crystal growth is terminated, the newly grown crystal is pulled upward into the cooling zone and is stopped there as shown in FIG. 5.

In the crystal cooling zone, the crystal is slowly cooled in a uniform or quasi-uniform temperature distribution which is maintained uniform by adjusting the electric power sent to the heaters H1, H2, and H3.

After the single semiconductor crystal is cooled to room temperature, it is detached from the LEC apparatus.

The crystal is 3 inches in diameter. The weight of the crystal is 3820 grams. The length is 19 cm. The crystal is a high quality GaAs single crystal without cracks.

The single GaAs crystal is sliced into wafers and the distributions of etch pit density (EPD) in the wafers are measured.

Figure 6A:
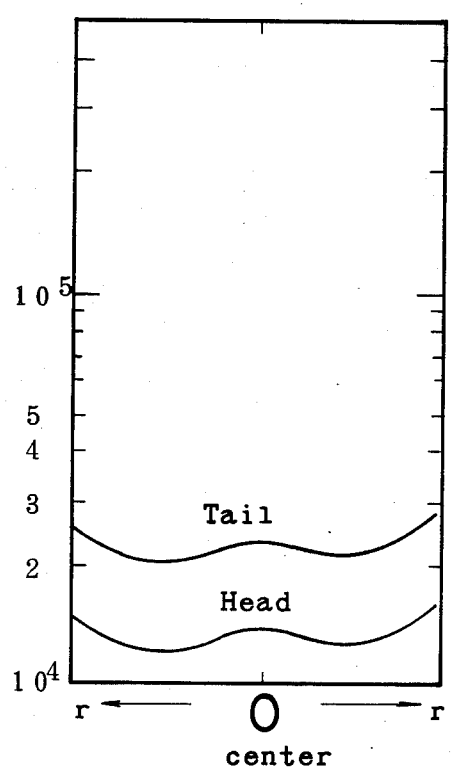
FIG. 6A is a graph showing the distribution of measured etch pit densities (EPD) on two wafers sliced from the head and tail portions of a GaAs single crystal grown using the method and an embodiment of the apparatus of the invention.

FIG. 6A is a graph showing the distribution of measured EPD on two wafers prepared in accordance with the invention, one sliced from the head portion and one sliced from the tail portion of the crystal. The abscissa denotes the distances from the center of the wafers. The ordinate denotes EPD on a logarithmic scale. The distributions of EPD on both the tail wafer and the head wafer are lower than $3 \times 10^4$ cm $^{-2}$.

Figure 6B:
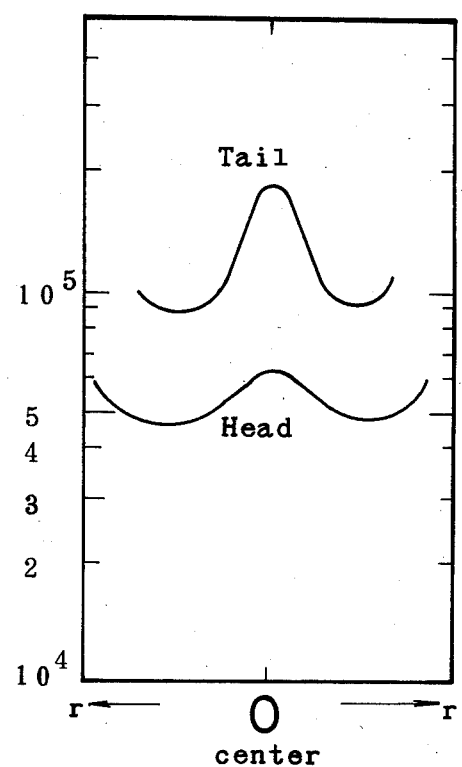
FIG. 6B is a graph showing the distribution of measured EPD's on two wafers sliced from the head and tail portions of a GaAs single crystal grown using a prior art LEC method and apparatus.

FIG. 6B is a graph showing the distributions of measured EPD on two wafers sliced from the head and tail portions of a GaAs single crystal grown by a conventional prior art LEC method and apparatus having only a single heater. The distributions of EPD on head and tail crystal wafers is about $10^5$ cm $^{-2}$.

A comparison of the EPD data in FIGS. 6A and 6B reveals that by employing the method and apparatus of the invention a reduction of EPD levels occurs to about $\frac{1}{3}$ to 1/6 the levels of EPD that occur with a conventional LEC method.

The single crystals made in accordance with the invention have not cracked during the cooling process.

After the single crystal is produced, it is subsequently subjected to grinding of the outer surface to adjust the diameter to a prescribed value. In addition, it undergoes marking of orientation flats which denote the crystallographic axes.

The single semiconductor crystals made in accordance with the invention do not crack during the grinding and marking steps. The yield of usable wafers after both the grinding of the outer surface to adjust the diameter in the allowable range from 3 inches minus 1 mm to 3 inches plus 1 mm and after marking orientation flats is about 60% with the invention. This is in sharp contrast to a crystal yield of usable wafer of about only 33% when a conventional LEC method is employed.

With the invention, an annealing treatment after cooling becomes unnecessary because the single crystals made by the invention do not crack. Thus, the overall amount of work required for processing is decreased.

Still greater decreases in the EPD occur reducing it to nearly 1/10 of the EPD in the embodiment graphically depicted in FIG. 6A by doping more than $10^{19}/cm^3$ of In or Sb into the crystal.

The method and apparatus of the invention have a wide scope of application for the growth of crystals of Group III and Group V semiconductor compounds such as GaAs, GaP, InP, InAs, GaSe, etc. and of Group IV and Group VI compounds such as PbTe, PbSe, SnTe, etc.

While the invention has been particularly shown and described with reference to the preferred embodiments thereof, it will be understood by those skilled in the art that various alterations in form and detail may be made therein without departing from the spirit and scope of the invention.

The embodiments of the invention in which a particular property or privilege is claimed are defined as follows:

1. A liquid encapsulation method for growing single crystals of GaAs comprising the steps of:
   melting a semiconductor compound material and a liquid encapsulant material in a melt-heating zone of a crucible by applying heat to form a two-layered liquid, the two-layered liquid comprising a top layer of said liquid encapsulant material and a bottom layer of said semiconductor compound material;
   dipping a seed crystal into the two-layered liquid;
   growing a crystal from the semiconductor compound melt in a crystal-growth zone by pulling up and rotating the seed crystal;
   cooling the crystal in a temperature-controlled cooling zone above the crucible, the cooling zone being kept at a substantially uniform temperature distribution with a small temperature gradient to provide slow cooling;
   using a first heater to control the temperature in said melt-heating zone;
   using a second heater to control the temperature in said crystal growth zone; and,
   using a third temperature control means to control the temperature in said cooling zone and wherein the temperature gradients along the axis of the crystal are such that the temperature gradient between the surface of the liquid encapsulant and the cooling zone is 5° C./cm to 50° C./cm; and, the temperature gradient in the cooling zone is from about 0° C./cm up to 20° C./cm while the cooling zone temperature is controlled by said third temperature control means to 1000° C.–700° C.

2. The method of claim 1 wherein the step of controlling the temperature of said cooling zone is accomplished by means of a heater.

3. The method of claim 1 wherein the step of controlling the temperature of said cooling zone is accomplished by means of a heat-shield.

* * * * *